(12) United States Patent
Ramaswamy et al.

(10) Patent No.: US 8,330,139 B2
(45) Date of Patent: Dec. 11, 2012

(54) MULTI-LEVEL MEMORY CELL

(75) Inventors: Durai Vishak Nirmal Ramaswamy, Bosie, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/072,504

(22) Filed: Mar. 25, 2011

(65) Prior Publication Data

US 2012/0241711 A1    Sep. 27, 2012

(51) Int. Cl.
*H01L 47/00* (2006.01)
*H01L 21/336* (2006.01)
*G11C 11/00* (2006.01)

(52) U.S. Cl. ............. 257/4; 257/E29.004; 438/467; 365/163

(58) Field of Classification Search ........... 257/4, 342, 257/202, E27.004; 438/257, 385, 467; 365/148, 365/53, 163
See application file for complete search history.

(56) References Cited

U.S. PATENT DOCUMENTS

| | | | |
|---|---|---|---|
| 5,687,112 A | 11/1997 | Ovshinsky | |
| 6,791,102 B2 | 9/2004 | Johnson et al. | |
| 7,524,722 B2 | 4/2009 | Lee et al. | |
| 7,697,316 B2 | 4/2010 | Lai et al. | |
| 2009/0134432 A1* | 5/2009 | Tabata et al. | 257/211 |
| 2010/0208508 A1 | 8/2010 | Baek | |

* cited by examiner

*Primary Examiner* — A. Sefer
*Assistant Examiner* — Nikolay Yushin
(74) *Attorney, Agent, or Firm* — Schwegman, Lundberg & Woessner, P.A.

(57) ABSTRACT

Some embodiments include a memory device and methods of forming the same. The memory device can include an electrode coupled to a memory element. The electrode can include different materials located at different portions of the electrode. The materials can create different dielectrics contacting the memory elements at different locations. Various states of the materials in the memory device can be used to represent stored information. Other embodiments are described.

34 Claims, 11 Drawing Sheets

STATE 0

STATE 1

STATE 2

STATE 3

MULTI-LEVEL MEMORY CELL

BACKGROUND

Computers and other electronic products, e.g., digital televisions, digital cameras, and cellular phones, often have a memory device to store information. Some types of conventional memory devices may have memory cells that are capable of storing multiple bits of information in each memory cell. In some cases, however, producing these types of memory devices may pose challenges.

DETAILED DESCRIPTION

Figure 1:
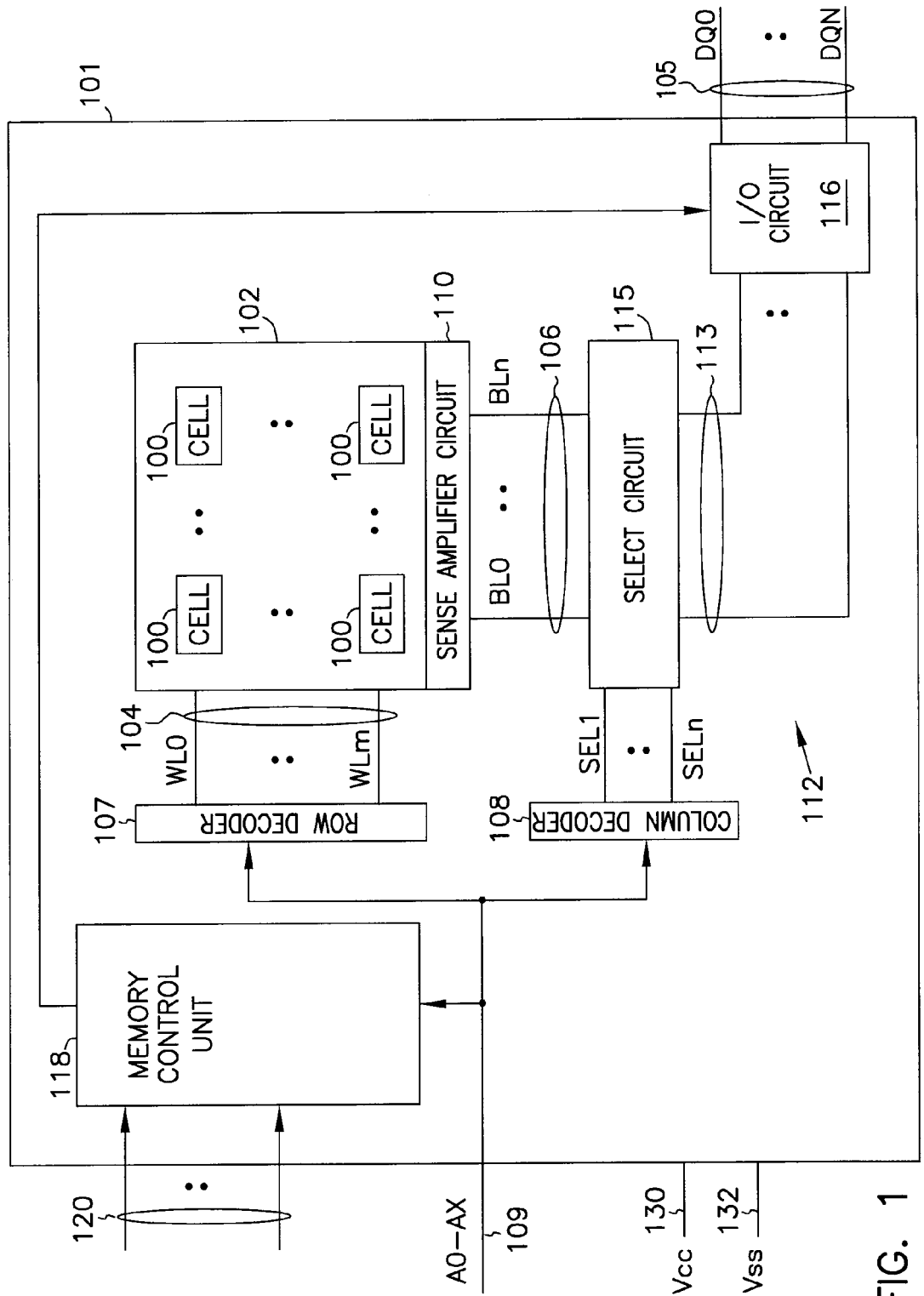
FIG. 1 shows a block diagram of a memory device having a memory array with memory cells, according to an embodiment of the invention.

FIG. 1 shows a block diagram of a memory device 101 having a memory array 102 with memory cells 100, according to an embodiment of the invention. Memory cells 100 can be arranged in rows and columns along with lines 104 (e.g., wordlines to conduct signals WL0 through WLm) and lines 106 (e.g., bit lines to conduct signals BL0 through BLn). Memory device 101 can use lines 104 and lines 106 to transfer information to and from memory cells 100. Row decoder 107 and column decoder 108 decode address signals A0 through AX on lines 109 (e.g., address lines) to determine which memory cells 100 are to be accessed.

A sense amplifier circuit 110 operates to determine the value of information read from memory cells 100 and provides the information in the form of signals to lines 106. Sense amplifier circuit 110 can also use the signals on lines 106 to determine the value of information to be written to memory cells 100.

Memory device 101 includes circuitry 112 to transfer information between memory array 102 and lines (e.g., data lines) 105. Signals DQ0 through DQN on lines 105 can represent information read from or written into memory cells 100. Lines 105 can include nodes within memory device 101 or pins (or solder balls) on a package where memory device 101 can reside. Other devices external to memory device 101 (e.g., a memory controller or a processor) can communicate with memory device 101 through lines 105, 109, and 120.

Memory device 101 can perform memory operations such as a read operation to read information from memory cells 100 and a programming operation (sometime referred to as write operation) to program (e.g., write) information into memory cells 100. Memory device 101 can also perform a memory erase operation to clear information from some or all of memory cells 100. A memory control unit 118 controls the memory operations based on control signals on lines 120. Examples of the control signals on lines 120 can include one or more clock signals and other signals to indicate which operation (e.g., a programming or read operation) memory device 101 can perform. Other devices external to memory device 101 (e.g., a processor or a memory controller) can control the values of the control signals on lines 120. Specific values of a combination of the signals on lines 120 can produce a command (e.g., programming or read command) that can cause memory device 101 to perform a corresponding memory operation (e.g., programming, read, or erase operation).

Each of memory cells 100 can be programmed to store information representing a value of a single bit or a value of multiple bits such as two, three, four, or another number of bits. For example, each of memory cells 100 can be programmed to store information representing a binary value "0" or "1" of a single bit. The single bit per cell is sometimes called a single level cell. In another example, each of memory cells 100 can be programmed to store information representing a value representing multiple bits, such as one of four possible values "00", "01", "10", and "11" of two bits, one of eight possible values "000", "001", "010", "011", "100", "101", "110" and "111" of three bits, or one of other values of another number of multiple bits. A cell that has the ability to store multiple bits is sometimes called a multi-level cell (or multi-state cell).

Memory device 101 can receive a supply voltage, including supply voltage signals Vcc and Vss, on lines 130 and 132, respectively. Supply voltage signal Vss can operate at a ground potential (e.g., having a value of approximately zero volts). Supply voltage signal Vcc can include an external voltage supplied to memory device 101 from an external power source such as a battery or an alternating-current to direct-current (AC-DC) converter circuitry.

Circuitry 112 of memory device 101 can include a select circuit 115 and an input/output (I/O) circuit 116. Select circuit 115 can respond to signals SEL1 through SELn to select the signals on lines 106 and 113 that can represent the information read from or programmed into memory cells 100. Column decoder 108 can selectively activate the SEL1 through SELn signals based on the A0 through AX address signals on lines 109. Select circuit 115 can select the signals on lines 106 and 113 to provide communication between memory array 102 and input/output (I/O) circuit 116 during read and programming operations.

Memory device 101 can include a non-volatile memory device and memory cells 100 can include non-volatile memory cells such that memory cells 100 can retain information stored thereon when power (e.g., Vcc, Vss, or both) is disconnected from memory device 101.

Each of memory cells 100 can include a memory element having a material, at least a portion of which can be programmed to change the resistance value of the material. Each of memory cells 100 can have a state corresponding to a resistance value when each of the memory cells 100 is programmed in a programming operation. Different resistance values can thus represent different values of information programmed in each of memory cells 100.

Memory device 101 can perform a programming operation when it receives (e.g., from an external processor or a memory controller) a programming command and value of information to be programmed into one or more selected memory cells among memory cells 100. Based on the value of the information, memory device 101 can program the selected memory cells to cause them to have appropriate resistance values to represent the values of the information.

One of ordinary skill in the art may recognize that memory device 101 may include other components, several of which are not shown in the figure, so as not to obscure the embodiments described herein.

Memory device 101 may include devices, memory cells, and operate using memory operations (e.g., programming and erase operations) similar to or identical to those described below with reference to FIG. 2 through FIG. 24.

Figure 2:
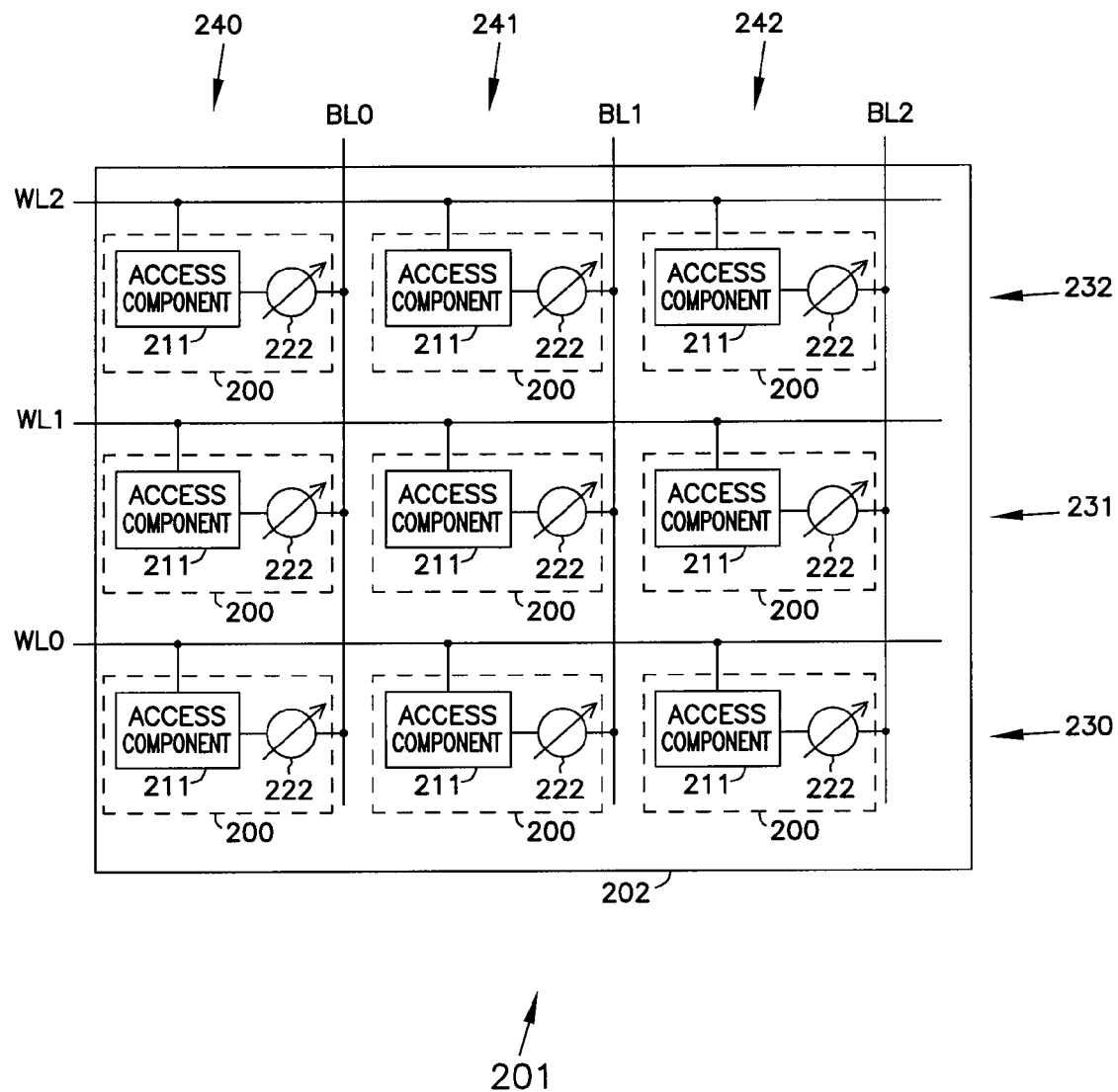
FIG. 2 shows a partial block diagram of a memory device having a memory array including memory cells with access components and memory elements, according to an embodiment of the invention.

FIG. 2 shows a partial block diagram of a memory device 201 having a memory array 202 including memory cells 200 with access components 211 and memory elements 222, according to an embodiment of the invention. Memory array 202 may be similar to or identical to memory array 102 of FIG. 1. As shown in FIG. 2, memory cells 200 can be arranged in rows 230, 231, and 232 along with lines (to conduct signals such as signals WL0, WL1, and WL2) and columns 240, 241, and 242 along with lines (to conduct signals such as signals BL0, BL1, and BL2). Access components 211 can turn on (e.g., by using appropriate values of signals WL0, WL1, and WL2) to allow access to memory elements 222 to read information from or program (e.g., write) information into memory elements 222.

Programming information into memory elements 222 can include causing the memory elements 222 to have specific target resistance values. Thus, reading information from memory elements 222 can include measuring a resistance value of memory elements 222. Measuring the resistance can include sensing a value of a current flowing through memory cell 200. Based on the value of the current, a corresponding value of the information stored in the memory can be determined.

Figure 3:
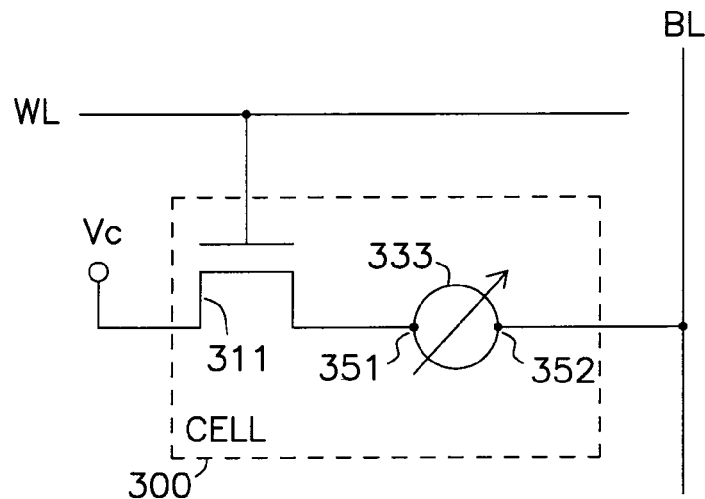
FIG. 3 through FIG. 5 show schematic diagrams of examples of different memory cells having different access components coupled to memory elements, according to various embodiments of the invention.
Figure 4:
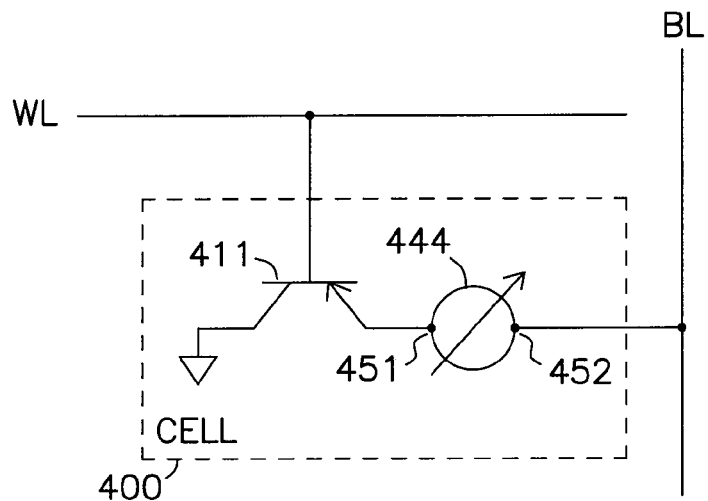
Figure 5:
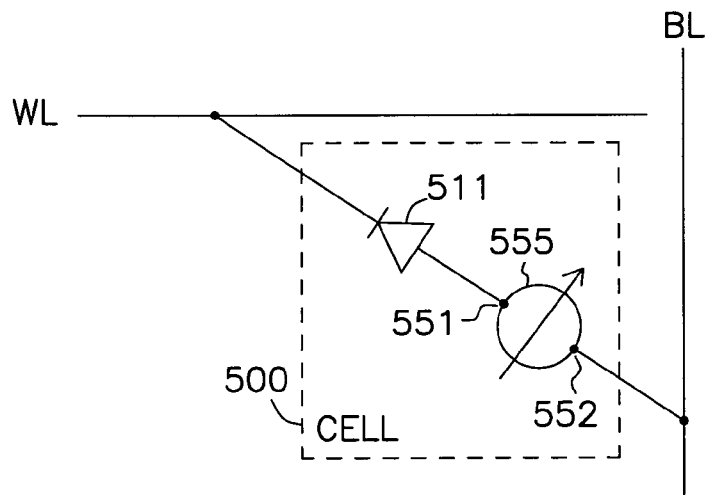

FIG. 3 through FIG. 5 show schematic diagrams of examples of different memory cells 300, 400, and 500 having different access components 311, 411, and 511 coupled to memory elements 333, 444, and 555, according to various embodiments of the invention. Lines labeled WL and BL in FIG. 3 through FIG. 5 can correspond to any one of lines 104 and any one of lines 106 of FIG. 1, respectively. FIG. 3 through FIG. 5 show examples of access components 311, 411, and 511 including a metal-oxide-semiconductor field-effect transistor (MOSFET), a bipolar junction transistor (BJT), and a diode, respectively. Memory cells 300, 400, and 500 can include other types of access components.

As shown in FIG. 3 through FIG. 5, each of memory elements 333, 444, and 555 can be coupled to and disposed between two electrodes, such as electrodes 351 and 352 (FIG. 3), electrodes 451 and 452 (FIG. 4), or electrodes 551 and 552 (FIG. 5). FIG. 3 through FIG. 5 schematically show electrodes 351, 352, 451, 452, 551, and 552 as dots. Structurally, each of these electrodes can include a conductive material, and the memory element (333, 444, or 555) can include a material that can be changed (e.g., in response to a signal) to have different resistance values. The value of information stored in the memory element can correspond to the resistance value of the memory element. Access components 311, 411, and 511 can enable signals (e.g., embodied as a voltage or current) to be transferred to and from memory elements 333, 444, and 555 via electrodes 351, 352, 451, 452, 551, and 552 during operations, such as read, programming, or erase operations.

A programming operation may use signal WL to turn on access components 311, 411, and 511, and then apply a signal (e.g., a signal having a programming voltage or current) through memory elements 333, 444, and 555. Such a signal can cause at least a portion of the material of memory elements 333, 444, and 555 to change. The change can be reversible (e.g., by performing an erase operation). For example, dielectrics with different sizes can be created in at least a portion of memory elements 333, 444, and 555 during a programming operation. The different sizes (e.g., different thicknesses) of the dielectric may cause memory elements 333, 444, and 555 to have different resistance values. These resistance values can be used to represent different states that represent different values of the information that can be stored in memory elements 333, 444, and 555.

A read operation may use signal WL to turn on access components 311, 411, and 511, and then apply a signal having a voltage or a current (e.g., a read voltage or current) through memory elements 333, 444, and 555. The read operation may measure the resistance of memory cells 300, 400, and 500 based on a read voltage or current to determine the corresponding value of information stored therein. For example, in each of memory cells 300, 400, and 500, a different resistance value can impart a different value (e.g., voltage or current value) to signal BL when a read current passes through memory elements 333, 444, and 555. Other circuitry of the memory device (e.g., a circuit such as I/O circuit 116 of FIG. 1) can use signal BL to measure the resistance value of memory elements 333, 444, and 555 to determine the value of the information.

The voltage or current used during a read, programming, and erase operations can different. For example, in a programming operation, the value of the signal (e.g., signals from line BL in FIG. 3 or FIG. 4 or from line WL in FIG. 5) that creates a current flowing through the memory element can be sufficient to cause the material of at least a portion of the memory element to change. The change can alter the resistance value of the memory element to reflect the value of the information to be stored in memory elements 333, 444, and 555.

In a read operation, the value (e.g., voltage value) of the signal (e.g., signals from line BL in FIG. 3 or FIG. 4 or from line WL in FIG. 5) that creates a current flowing through the memory element can be sufficient to create the current but insufficient to cause any portion of the memory element to change. Thus, the value of the information stored in the memory element can remain unchanged during and after the read operation.

In an erase operation, the value (e.g., voltage value) of the signal (e.g., signals from line BL in FIG. 3 or FIG. 4 or from line WL in FIG. 5) can have an opposite polarity from the voltage use in a programming operation. This signal can change (e.g., reset) the material of the memory element to its original state, e.g., a state before any programming is performed to the memory cells.

Memory cells 100, 200, 300, 400, and 500 of FIG. 1 through FIG. 5 can include a memory cell having a structure similar to or identical to one or more of the memory cells described below with reference to FIG. 6 through FIG. 21.

Figure 6:
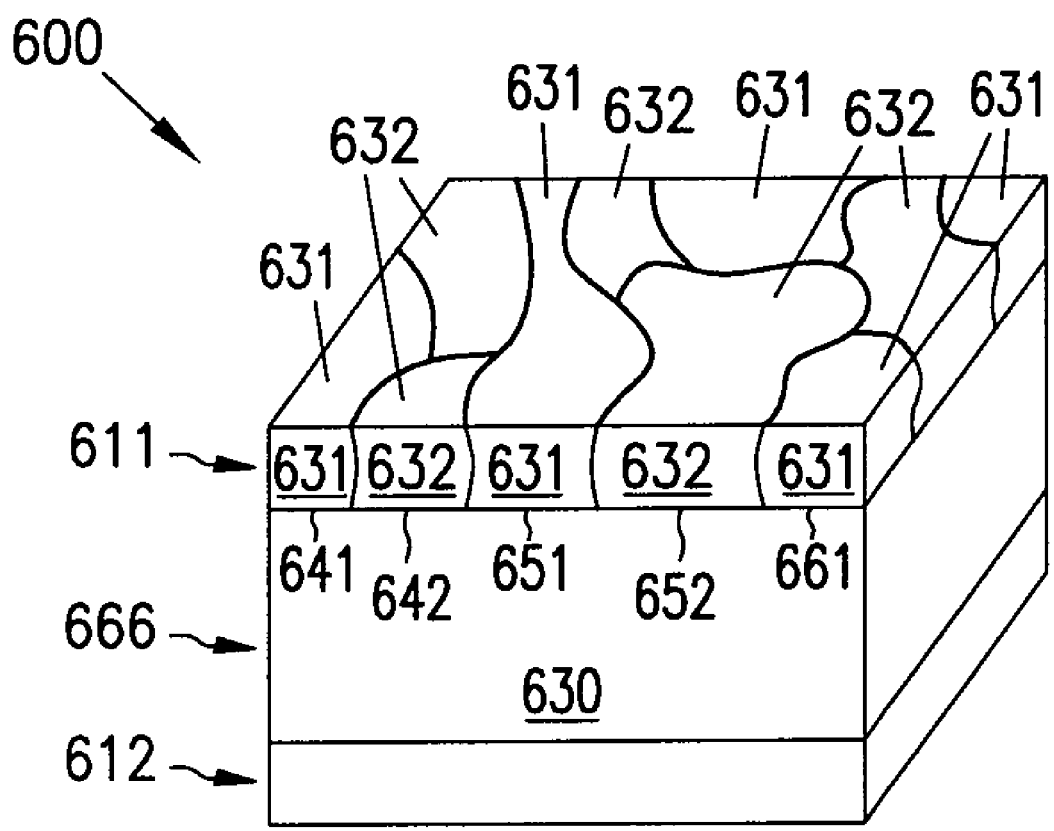
FIG. 6 shows a 3-dimensional (3D) view of a portion of a memory cell, according to an embodiment of the invention.

FIG. 6 shows a 3D view of a portion of a memory cell 600, according to an embodiment of the invention. The material in memory cell 600 can have different states to store information representing a single bit or multiple bits, as described in more detail below with reference to FIG. 7 through FIG. 11. As shown in FIG. 6, memory cell 600 includes a memory element 666 coupled to and disposed between electrodes 611 and 612.

Electrode 611 includes different materials 631 and 632, e.g., different metals. As shown in FIG. 6, each of materials 631 and 632 includes different portions located in different portions of electrode 611. The portions of materials 631 and 632 can be approximately randomly located in electrode 611. Portions of materials 631 and 632 can physically contact each other but they may not chemically bond to each other. For example, portions of materials 631 and 632 may not bond to each other as an alloy or as a compound.

The portions of electrodes 611 and 612 can directly contact memory element 666 at different locations in memory element 666. For example, FIG. 6 shows three different portions of material 631 directly contacting memory element 666 at three different locations 641, 651, and 661 of memory element 666. In another example, FIG. 6 shows two different portions of material 632 directly contacting memory element 666 at two different locations 642 and 652 of memory element 666.

These direct contacts may allow each of materials 631 and 632 to react with a material 630 of memory element 666 during an operation (e.g., a programming operation) of memory cell 600 to cause memory cell 600 to have different states. The states can be used to represent different values of information stored in memory cell 600.

Materials 631 and 632 can include different materials (e.g., different conductive materials). Each of materials 631 and 632 can include only a single element (e.g., only a single metal). For example, material 631 can include only a single metal (e.g., only aluminum) and material 632 can include only a single metal (e.g., titanium) that is different from the metal of material 631. Alternatively, one of materials 631 and 632 can include only a single element (e.g., only a single metal) and the other material can include a combination (e.g., a compound) of two or more elements. Moreover, each of material 631 and 632 can include a combination of two or more elements. For example, material 631 can include a combination of two or more elements and material 632 can include another combination of two or more elements that is different from the combination of the elements of material 631.

Examples of materials 631 and 632 include Al, Pt, Ti, W, TiN, TaN, WN, Ru, $RuO_x$, W, $HfSi_x$, and $NiSi_x$, and other metals or materials.

Material 630 (sometimes referred to as a memory material) of memory element 666 can include a dielectric material, which can have a combination of materials, including oxygen. Examples of material 630 include $Pr_xCa_yMn_zO$, $La_x$-$Ca_yMnO_z$, $La_xSr_yCo_xY$, $TiO_x$, $HfO_x$, $ZrO_x$, and other dielectric materials.

Electrode 612 can include a conductive material. The material of electrode 612 can be an inert material, such that it may remain unchanged (e.g., does not react with material 630) when a signal is applied to electrode 611 (e.g., during programming of memory cell 600). Examples of the material of electrode 612 include Al, Pt, Ti, W, TiN, TaN, WN, Ru, $RuO_x$, W, $HfSi_x$, $NiSi_x$ and other metals or materials.

Memory cell 600 may include a conductive contact (not shown in FIG. 6) coupled to electrode 611 and contacting both materials 631 and 632, such that a signal (e.g., a signal having a bias voltage) can be applied to the entire electrode 611 through such conductive contact. Thus, through such a conductive contact (which contacts both materials 631 and 632), the same signal can be applied to both materials 631 and 632 of electrode 611 at the same time.

FIG. 7 through FIG. 11 show memory cell 600 of FIG. 6 having various states and dielectrics, according to an embodiment of the invention. Under a certain condition, such as under the application of a signal (e.g., signal having a bias voltage) to electrode 611 during a programming operation performed on memory cell 600, materials 631 and 632 can react with material 630. As described below, this reaction creates dielectrics at the interfaces between different portions of materials 631 and 632 in electrode 611 and material 630. The presence or absence of the dielectrics or the size of the dielectrics can cause memory cell 600 to have different states.

FIG. 7 through FIG. 11 show four example states in memory cell 600, including state 0, state 1, state 2, and state 3. These states can be created by applying signals with different values (e.g., bias voltage values) to electrode 611 during an operation such as a programming operation.

Figure 7:
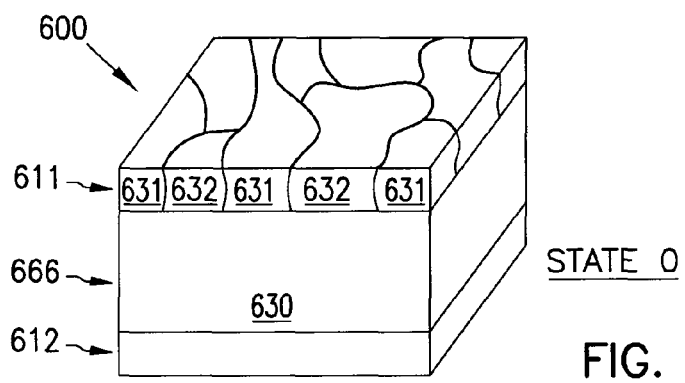
FIG. 7 through FIG. 11 show the memory cell of FIG. 6 having various states and dielectrics, according to an embodiment of the invention.

In FIG. 7, no dielectrics are created in memory element 666. Thus, in this case, memory cell 600 can have state 0.

Figure 8:
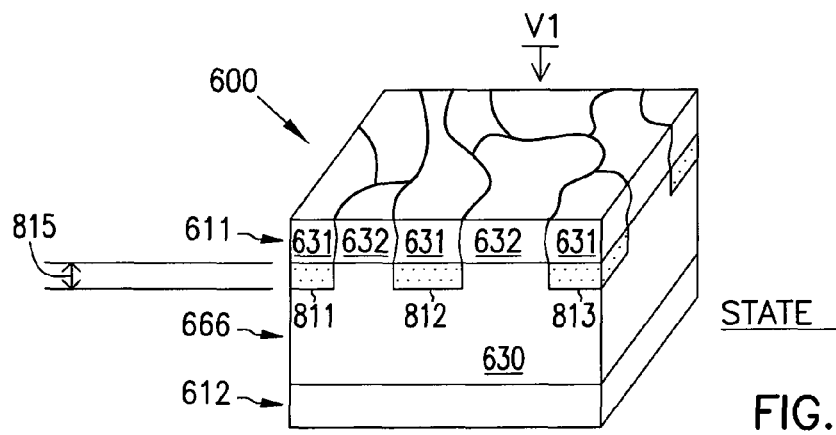

In FIG. 8, in response to a signal having a voltage V1 (e.g., a positive bias voltage V1) being applied to electrode 611, material 631 of electrode 611 may react with material 630 of memory element 666 to create dielectrics 811, 812 and 813 with a thickness 815 at the interfaces between three different portions of material 631 in electrode 611 and material 630 of memory element 666. Since dielectrics 811, 812 and 813 are created in part from material 631 of electrode 611, dielectrics 811, 812 and 813 can directly contact material 631 in different portions in electrode 611. Dielectrics 811, 812 and 813 can include an oxide of material 631. The oxygen in dielectrics 811, 812 and 813 can be provided by material 630. For example, in response to the signal having a positive voltage (e.g., V1), negative oxygen ions from material 630 may move to electrode 611 and react with material 631. The reaction creates an oxide of material 631, which are dielectrics 811, 812, and 813.

Dielectrics 811, 812, and 813 in FIG. 8 change the structure of memory element 666 relative to the structure shown in FIG. 7. Thus, the state of memory cell 600 can also change, such as from state 0 (FIG. 7) to state 1 (FIG. 8).

As shown in FIG. 8, the application of the signal having voltage V1 may create dielectrics 811, 812 and 813 between only portions of material 631 and material 630, without creating a dielectric between any portion of material 632 and material 630. This can be attributed to materials 631 and 632 being different from each other. Different materials (e.g., different metals) have different propensities to form oxide, e.g., based on the Gibb's free energy of oxide formation. Thus, if material 631 (e.g., aluminum) is more reactive to oxide formation than material 632 (e.g., titanium), then between the interface of electrode 611 and material 630, only an oxide of material 631 (e.g., an oxide of aluminum) may be created between portions of material 631 and material 630 in response to voltage V1. In this example, under the same voltage V1, no oxides (e.g., no oxide of titanium) may be created between portions of material 632 and material 630. However, if a voltage applied to electrode 611 is increased (e.g., a voltage greater than V1), then dielectrics may also be created between portions of material 632 and material 630.

Figure 9:
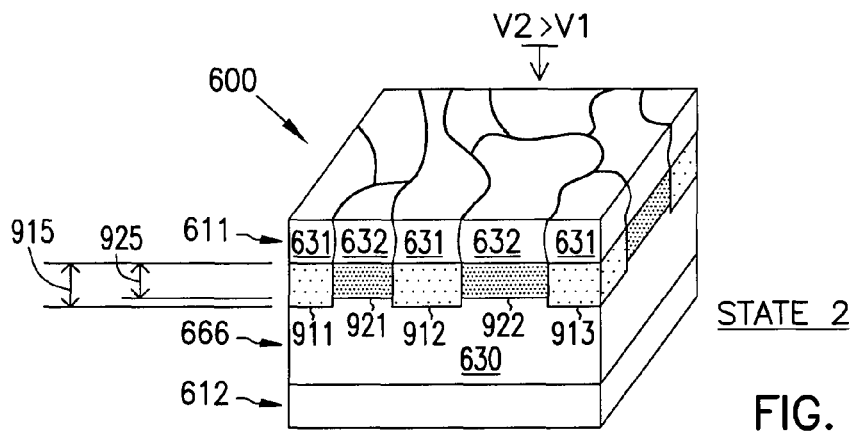

In FIG. 9, in response to a signal having a voltage V2 (e.g., a positive bias voltage V2 greater than V1 of FIG. 8) applied to electrode 611, material 632 of electrode 611 may react with material 630 to create dielectrics 921 and 922 with a thickness 925 at the interfaces between two different portions of material 632 in electrode 611 and material 630. Since dielectrics 921 and 922 are created in part from material 632 of electrode 611, dielectrics 921 and 922 can directly contact material 632 in different portions in electrode 611. Dielectrics 921 and 922 can include an oxide of material 632. The oxide in dielectrics 921 and 922 can be provided by material 631. For example, in response to the signal having a positive voltage (e.g., V2), negative oxygen ions from material 630 move to electrode 611 and react with material 632. The reaction creates an oxide of material 632, which are dielectrics 921 and 922.

The application of the signal having voltage V2 to electrode 611 may also create dielectrics 911, 912 and 913 with a thickness 915 at the interfaces between three different portions of material 631 and material 630. As shown in FIG. 9, dielectrics 911, 912, and 913 have a size (e.g., thickness 915) greater than the size (e.g., thickness 815) of dielectrics 811, 812, and 813 of FIG. 8. In some situations, depending on material 631, the application of the signal having voltage V1 (FIG. 8) may saturate the mechanism for creating dielectrics 811, 812, and 813. In such situations, the application of the signal having voltage V2 (FIG. 9) to electrode 611 may cause the size (e.g., thickness 915) of dielectrics 911, 912, and 913 to be the same (or substantially the same) as the size (e.g., thickness 815) of dielectrics 811, 812, and 813 of FIG. 8.

Dielectrics 911, 912, and 913, and dielectrics 921 and 922 in FIG. 9 change the structure of memory element 666 relative to the structure shown in FIG. 8. Thus, the state of memory cell 600 can also change, such as changing from state 1 (FIG. 8) to state 2 (FIG. 9).

Figure 10:
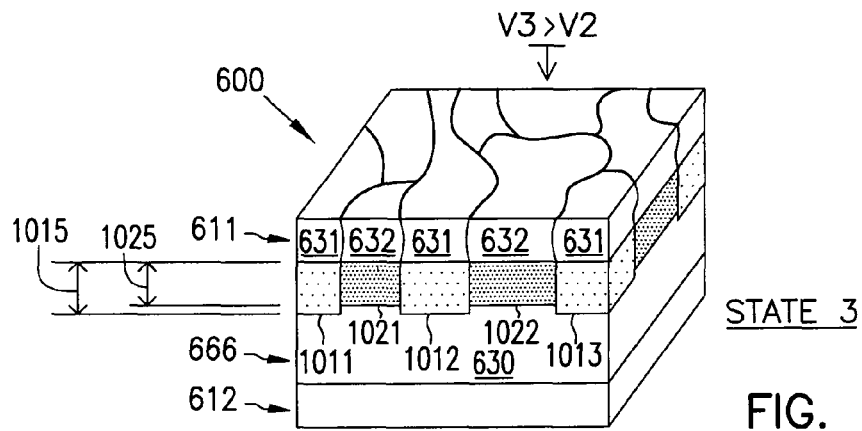

In FIG. 10, an application of the signal having voltage V3 (e.g., a positive bias voltage V3 greater than V2 of FIG. 10) to electrode 611 may create dielectrics 1011, 1012 and 1013 with a thickness 1015 at the interfaces between three different portions of material 631 and material 630. As shown in FIG. 10, dielectrics 1011, 1012, and 1013 have a size (e.g., thickness 1015) greater than the size (e.g., thickness 915) of dielectrics 911, 912, and 913 of FIG. 8. In some situations, depending on material 631, the application of the signal having voltage V2 (FIG. 9) may saturate the creation of dielectrics 911, 912, and 913. In such situations, the application of the signal having voltage V3 (FIG. 10) to electrode 611 may cause the size (e.g., thickness 1015) of dielectrics 1011, 1012 and 1013 to be the same (or substantially the same) as the size (e.g., thickness 915) of dielectrics 911, 912 and 913 of FIG. 9.

The application of the signal having voltage V3 to electrode 611 may also create dielectrics 1021 and 1022 with a thickness 1025 between two different portions of material 632 and material 630. Thickness 1025 can be greater than thickness 925 of FIG. 9. In some situations, depending on material 632, the application of the signal having voltage V2 (FIG. 9) may saturate the mechanism used to create dielectrics 921 and 922 (FIG. 9). In such situations, the application of the signal having voltage V3 (FIG. 10) to electrode 611 may cause the size (e.g., thickness 1015) of dielectrics 1021 and 1022 to be the same (or substantially the same) as the size (e.g., thickness 925) of dielectrics 921 and 922 of FIG. 9.

Dielectrics 1011, 1012, and 1013, and dielectrics 1021 and 1022 in FIG. 10 change the structure of memory element 666 relative to the structure shown in FIG. 9. Thus, the state of memory cell 600 can also change, such as from state 2 (FIG. 9) to state 3 (FIG. 10).

As described above with reference to FIG. 6, the material of electrode 612 can be an inert material during an application of a signal to electrode 611, such that the material of electrode 611 may remain unchanged and may not react with material 630 during the application of such a signal. Thus, during the applications of the signals having voltages V1, V2, and V3 to electrode 611, as shown in FIG. 8 through FIG. 10, respectively, no dielectrics are created at the interface between electrode 612 and material 630. Therefore, electrode 612 can remain directly contacting material 630, without a presence of a dielectric between electrode 612 and material 630.

The application of the signals having voltage V1, V2, and V3 to create the dielectrics between the interface of electrode 611 and material 630, as described above with reference to FIG. 7 through FIG. 10, can be applied during a programming operation.

Figure 11:
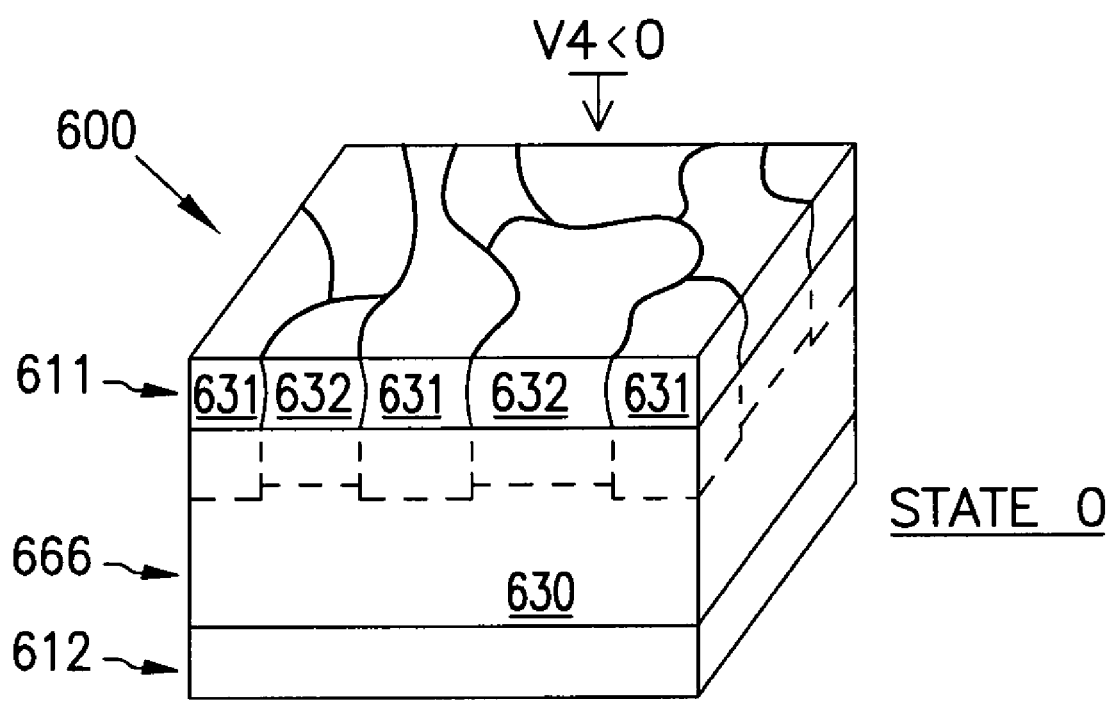
Figure 12:
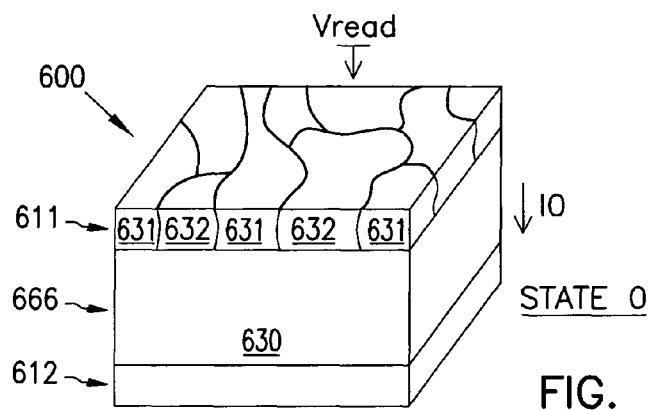
FIG. 12 through FIG. 15 show the memory cells of FIG. 7 through FIG. 10 having different values of currents in response to another signal applied to the electrode of the memory cell, according to an embodiment of the invention.
Figure 13:
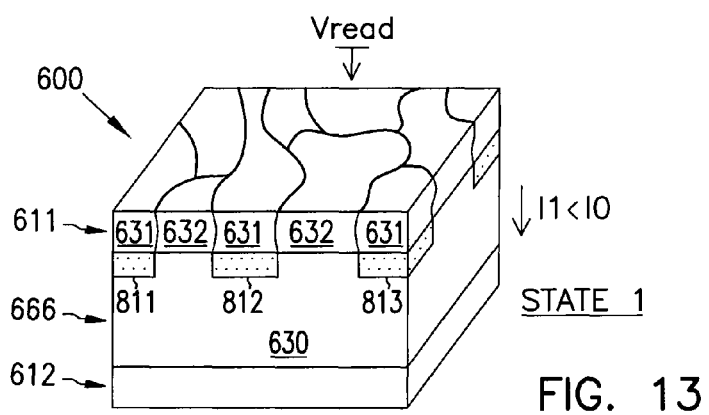
Figure 14:
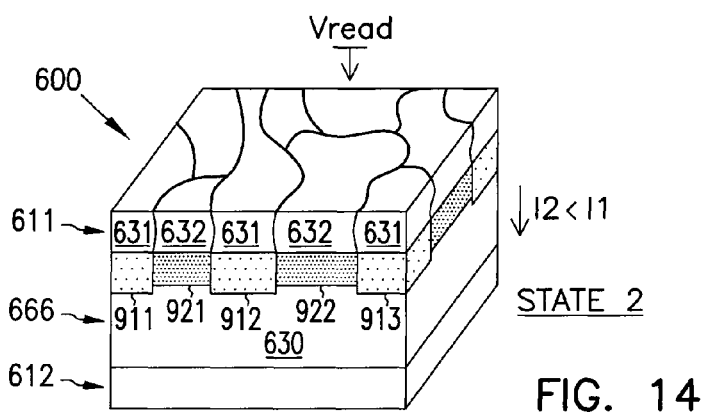
Figure 15:
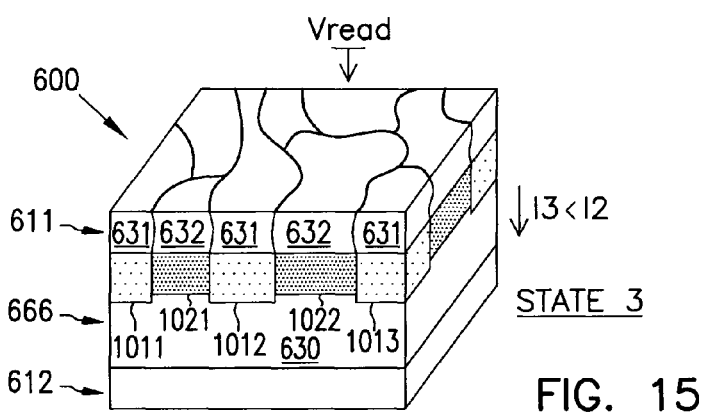

In FIG. 11, an application of the signal having voltage V4 with a polarity that is opposite to that of V1, V2, V3 (e.g., a negative bias voltage V4) to electrode 611 may reduce the size (e.g., thickness) of some or all of dielectrics between the interface of electrode 611 and material 630 of memory element 666. The application of the signal having voltage V4 can be applied to electrode 611 during an operation such as an erase operation. In response to the signal having a negative voltage (e.g., V4) applied to electrode 611, negative oxygen ions from the dielectrics may move to material 630, thereby reducing the size of the dielectrics. If the negative voltage at electrode 611 is sufficiently large, it may dissolve the dielectrics. Memory cell 600 may return to its original state (e.g., state 0) when the dielectrics are dissolved.

For example, if memory cell 600 is in any of state 1 (FIG. 8), state 2 (FIG. 9), or state 3 (FIG. 10), the application of the signal having voltage V4 (e.g., with a polarity that is opposite to that of V1, V2, V3) to electrode 611 may dissolve the dielectrics between electrode 611 and material 630 in these states. In this example, memory cell 600 may return from state 1, state 2, or state 3 to state 0 (as shown in FIG. 11), which is the same state of memory cell 600 in FIG. 7, where no dielectrics are present in memory element 666.

As described above, the states, such as states 0, 1, 2, and 3 of memory cell 600 can be used to represent information stored in memory cell 600. For example, memory cell 600 can be used as a non-volatile 2-bit memory cell. States 0, 1, 2, and 3, as described above, can be used to represent four possible combinations of the two bits.

FIG. 7 through FIG. 11 show the creation of four states 0, 1, 2, and 3 of memory cell 600 as an example; other numbers of states can be created, by applying different signals having different voltage values to create different states. For examples, eight signals (or a single signal) having eight different voltages can be applied to electrode 611 to create eight corresponding different states in memory cell 600. The eight different states can be used to represent eight different possible combinations of three bits. In this example, memory cell 600 can be used as a non-volatile 3-bit memory cell.

The state of memory cell 600, such as states 0, 1, 2, and 3, can be created during a programming of a memory device (e.g., memory device 101) in which memory cell 600 resides. The information can be retrieved (e.g., read) in an operation such as a read operation.

FIG. 12 through FIG. 15 show memory cell 600 of FIG. 7 through FIG. 10 having different values of currents I0, I1, I2, and I3 in response to a signal having a voltage Vread applied to electrode 611, according to an embodiment of the invention. The application of the signal having voltage Vread can be applied to electrode 611 during an operation such as a read operation.

As shown in FIG. 12 through FIG. 15, memory element 666 has dielectrics (or no dielectric in FIG. 12) with different sizes. Thus, memory element 666 can have different resistance values in FIG. 12 through FIG. 15. For example, based on the size of the dielectrics, the resistance value in state 0 can be less than the resistance value in state 1. The resistance value in state 1 can be less than the resistance value in state 2. The resistance value in state 2 can be less than the resistance value in state 3. Since the resistance value of memory elements are different in different states and since the value of current through memory element 666 is inverse proportional to the resistance value of memory element 666, currents I0, I1, I2, and I3 can also have different values. Thus, I1<I0, I2<I1, and I3<I2.

The value of Vread can be sufficient to create currents I0, I1, I2, and I3 but insufficient to cause any portion of the memory element 666 to change. For example, the value of voltage Vread can be selected such that the sizes (e.g., thicknesses) of the dielectrics remain unchanged. Thus, the information stored in the memory element 666 can remain unchanged during and after the read operation.

In the description above with respect to FIG. 6 through FIG. 15, electrode 611 of memory cell 600 includes two materials 631 and 632 as an example. The number of materials in electrode 611 can be greater than two.

Figure 16:
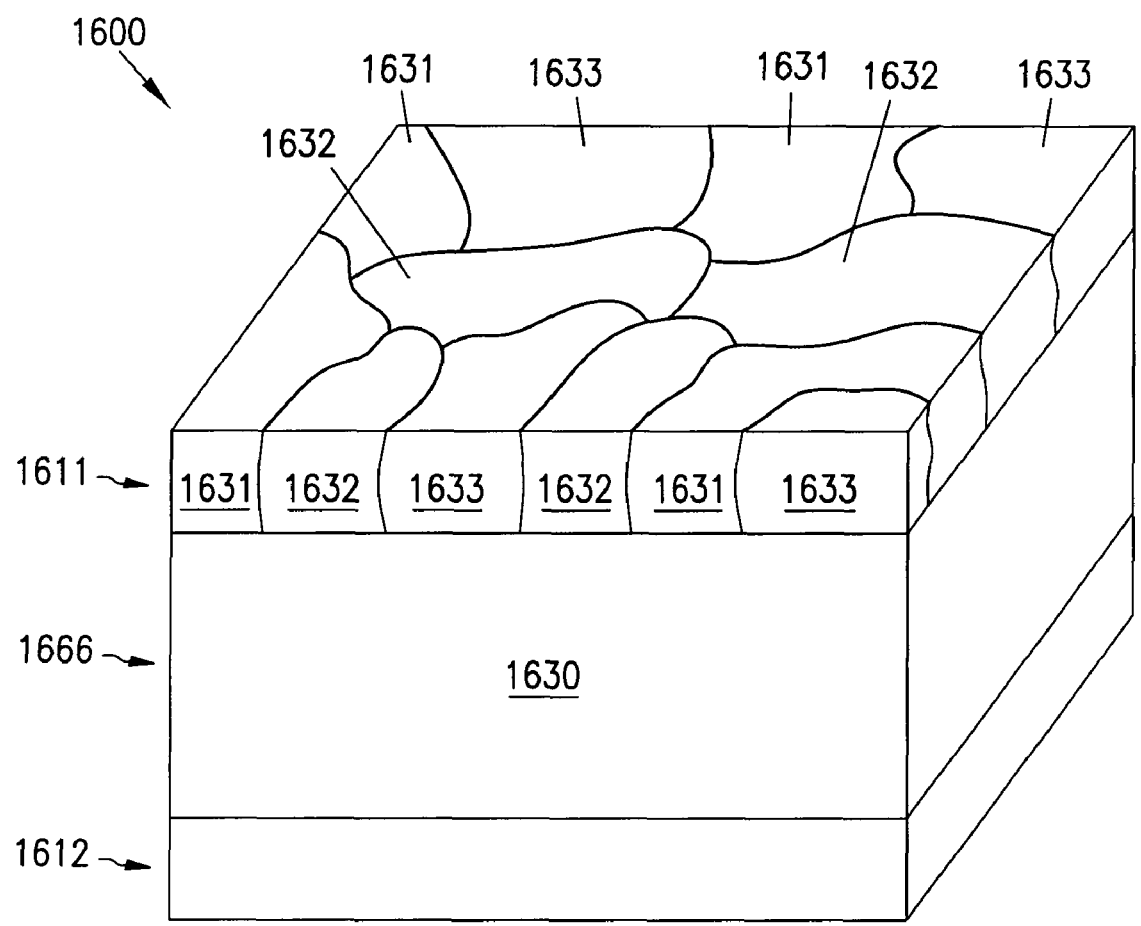
FIG. 16 shows a 3D view of a portion of another memory cell, according to an embodiment of the invention.

FIG. 16 shows a 3D view of a portion of a memory cell 1600, according to an embodiment of the invention. Memory cell 1600 is different from memory cell 600 described above with reference to FIG. 6 through FIG. 15 in that memory cell 1600 can include three different materials, 1631, 1632, and 1633. In comparison, memory cell 600 has two materials.

As shown in FIG. 16, memory cell 1600 includes a memory element 1666 coupled to and disposed between electrodes 1611 and 1612. Memory element 1666 can include material 1630 to store information representing a single bit or multiple bits. Materials 1631, 1632, and 1633 can be located at different portions in electrode 1611. As shown in FIG. 16, each of materials 1631, 1632, and 1633 includes different portions located in different portions of electrode of 611. The portions of materials 1631, 1632, and 1633 can be approximately randomly located in electrode 1611. The portions of materials 1631, 1632, and 1633 can physically contact each other but they may not chemically bond to each other. For example, portions of materials 1631, 1632, and 1633 may not bond to each other as an alloy or as a compound.

Memory cell 1600 can include materials and operations similar to memory cell 600. For example, since electrode 1611 includes three different materials 1631, 1632, and 1633, three different oxides of these materials (e.g., three different metal oxides) can be created at different locations between electrode 1611 and material 1630.

Electrode 1612 can include materials similar to or identical to those of electrode 612. Material 1630 can include materials similar to or identical to those of material 630.

Materials 1631, 1632, and 1633 can include materials similar to or identical to those of materials 631 and 632. Materials 1631, 1632, and 1633 can include three different conductive materials. Each of materials 1631, 1632, and 1633 can include only a single element (e.g., only a single metal). For example, each of materials 1631, 1632, and 1633 can include only a single metal different from one another. Alternatively, one or two of materials 1631, 1632, and 1633 can include only a single element and the other material can include a combination of two or more elements. Moreover, each of material 1631, 1632, and 1633 can include a combination of two or more elements.

Memory cell 600 (FIG. 6) and 1600 (FIG. 16) can be formed by processes described below with reference to FIG. 17 through FIG. 24.

Figure 17:
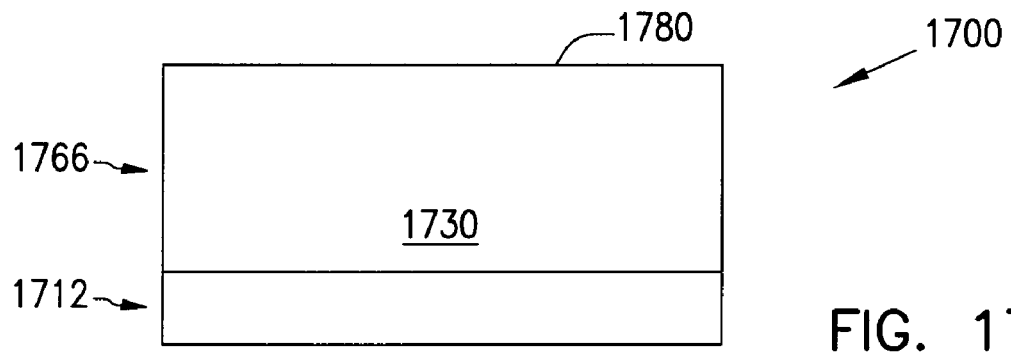
FIG. 17 through FIG. 24 show various processes of forming a memory cell, according to an embodiment of the invention.
Figure 18:
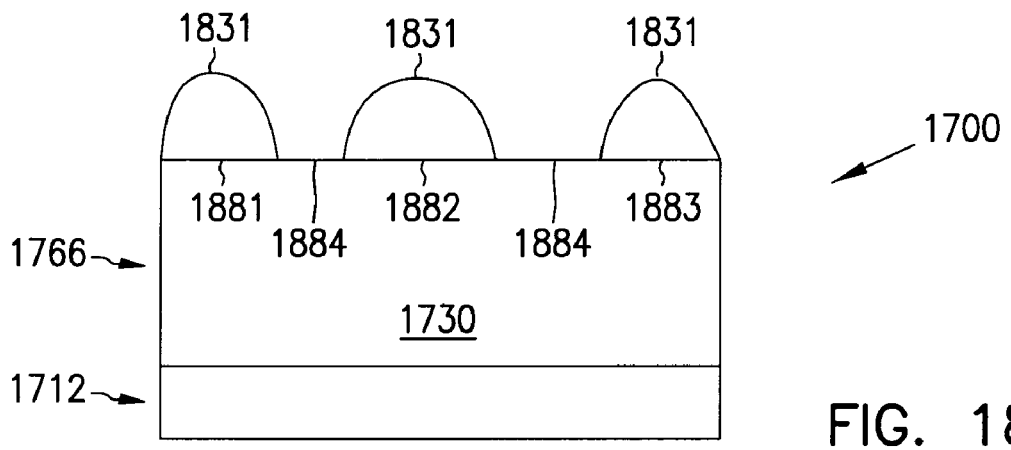
Figure 19:
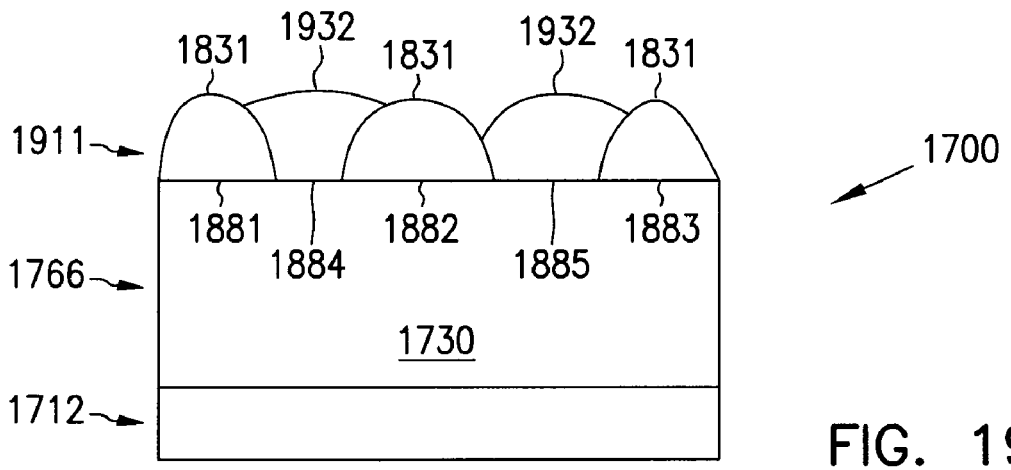

FIG. 17 through FIG. 19 show various processes of forming a memory cell 1700, according to an embodiment of the invention. In FIG. 17, a memory element 1766 has been formed on an electrode 1712. Forming memory element 1766 can include depositing a material 1730 on electrode 1712. Material 1730 of memory element 1766 and the material of electrode 1712 can be similar to or identical to the materials of memory element 666 and electrode 612, respectively, of FIG. 6. As shown in FIG. 17, material 1730 has a surface 1780.

In FIG. 18, material 1831 has been formed on surface 1780 of material 1730. Forming material 1831 can include forming different portions (e.g., by growing islands) of material 1831 on only some areas 1881, 1882, and 1883 of surface 1780. Areas 1881, 1882, and 1883 can be approximately randomly selected areas on surface 1780. Some other areas, such as areas 1884 and 1885, of surface 1780 are uncovered by material 1831. Areas 1884 and 1885 can be approximately randomly selected areas on surface 1780.

In FIG. 19, material 1932 has been formed on areas 1884 and 1885 of surface 1780. Forming material 1932 can include forming different portions of material 1831 on areas 1884 and 1885 of surface 1780. As shown in FIG. 19, portions of materials 1831 and 1932 can physically contact each other. Materials 1831 and 1932 may not bond to each other as an alloy or as a compound. Materials 1831 and 1932 can be part of an electrode 1911 of memory cell 1700.

The amount (e.g., ratio) of materials 1831 and 1932 in electrode 1911 can be selected and adjusted such that different states (e.g., states 0, 1, 2, and 3) can be created in memory cell 1700. Thus, based on the desired number of states of memory cell 1700, the amount of materials 1831 and 1932 can be the same or different.

Each of materials 1831 and 1932 can include only a single element. For example, material 1831 can include only a single metal and material 1932 can include only a single metal that is different from the metal of material 1831. Alternatively, one of materials 1831 and 1932 can include only a single element and the other material can include a combination of two or more elements. Moreover, each of material 1831 and 1932 can include a combination of two or more elements. For example, material 1831 can include a combination of two or more elements and material 1932 can include another combination of two or more elements that is different from the combination of the elements of material 1831.

Materials 1831 and 1932 can be similar to or identical to the materials of materials 631 and 632, respectively, of FIG. 6.

As described above, materials 1831 and 1932 can be formed on surface 1780 in different process steps. For example, material 1831 (FIG. 18) can be formed on some areas of surface 1780 in one process step. Then, material 1932 (FIG. 19) can be formed on other areas of surface 1780 in another process step.

The above processes of forming a memory cell 1700 include two materials 1831 and 1932, as an example. More than two materials can be formed, using processes similar to those described above with reference to FIG. 17 through FIG. 19. For example, three different materials can be formed on surface 1780 (FIG. 17) of material 1730. In this example, after forming material 1831 in FIG. 18, material 1932 in FIG. 19 can be formed not on an entire area 1884 and not on an entire area 1885 but formed only on a part of area 1884 and only on a part of area 1885. This leaves a remaining part of area 1884 and a remaining part of area 1885 uncovered by material 1932. Then an additional material different from materials 1831 and 1932 can be formed on the remaining part of area 1884 and on the remaining part of area 1885. Thus, in this example, three different materials (e.g., three different metals) can be formed on surface 1780 (FIG. 17) of material 1730.

Figure 20:
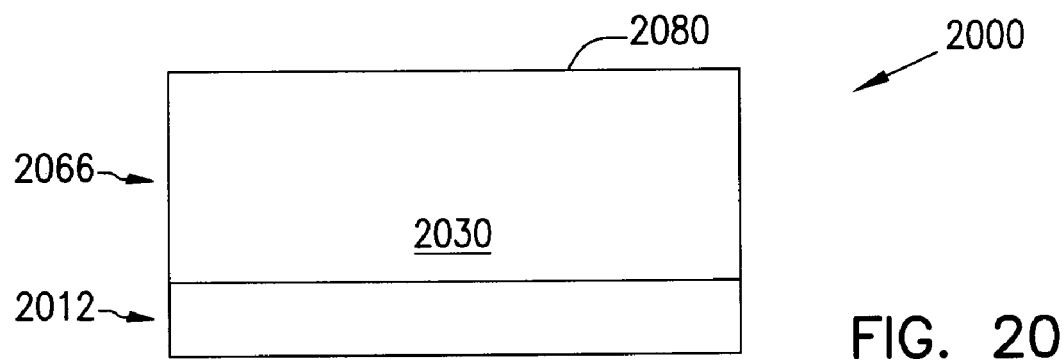
Figure 21:
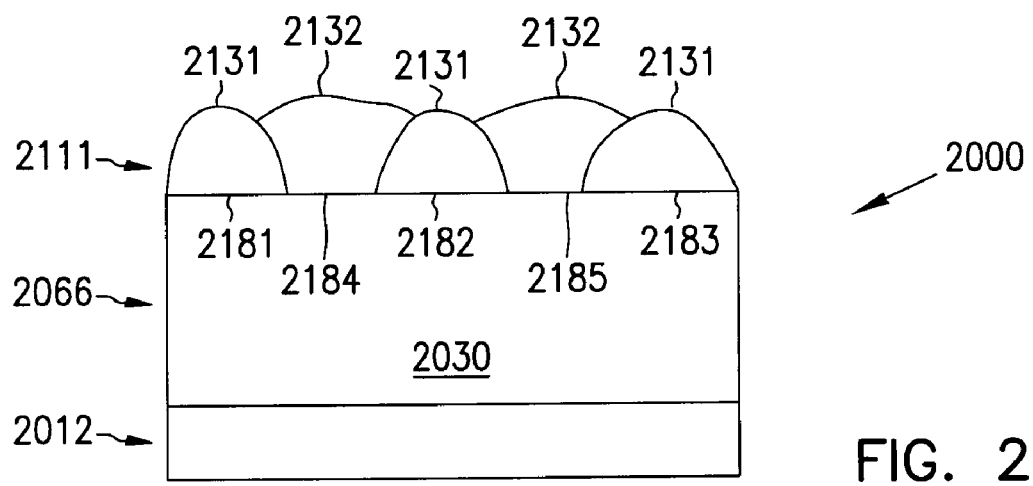

FIG. 20 and FIG. 21 show various processes of forming a memory cell 2000, according to an embodiment of the invention. In FIG. 20, a memory element 2066 has been formed on an electrode 2012. Forming memory element 2066 can including depositing a material 2030 on electrode 2012.

Material 2030 of memory element 2066 and the material of electrode 1712 can be similar to or identical to the materials of memory element 666 and electrode 612, respectively, of FIG. 6. As shown in FIG. 20, material 2030 has a surface 2080.

In FIG. 21, materials 2131 and 2132 have been formed on surface 2180 of material 2130. Materials 2131 and 2132 can be formed as part of the same process step, for example, by depositing materials 2131 and 2132 on surface 2180 at the same time. Materials 2131 and 2132 can be part of an electrode 2111 of memory cell 2000. As shown in FIG. 21, materials 2131 and 2132 can include portions that can be approximately randomly formed on areas 2181, 2182, 2183, 2184 and 2185 of surface 2080. As shown in FIG. 21, portions of materials 2131 and 2132 can physically contact each other. Materials 2131 and 2132 may not bond to each other as an alloy or as a compound.

The amount (e.g., ratio) of materials 2131 and 2132 in electrode 2111 can be selected and adjusted such that different states can be created in memory cell 2000. Thus, based on the number of desired states of memory cell 2000, the amount of materials 2131 and 2132 can be the same or different.

Each of materials 2131 and 2132 can include only a single element. For example, material 2131 can include only a single metal and material 2132 can include only a single metal that is different from the metal of material 2131. Alternatively, one of materials 2131 and 2132 can include only a single element and the other material can include a combination of two or more elements. Moreover, each of material 2131 and 2132 can include a combination of two or more elements. For example, material 2131 can include a combination of two or more elements and material 2132 can include another combination of two or more elements that is different from the combination of the elements of material 2131.

Materials 2131 and 2132 can be similar to or identical to the materials of materials 631 and 632, respectively, of FIG. 6.

The above processes of forming a memory cell 2000 include two materials 2131 and 2132, as an example. More than two materials can be formed, using processes similar to those described above with reference to FIG. 20 and FIG. 21. For example, three different materials can be formed on surface 2080 (FIG. 20) of material 2030. In this example, the three different materials (e.g., three different metals) can be formed in the same process step, for example, by depositing three different materials on surface 2080 at the same time.

Figure 22:
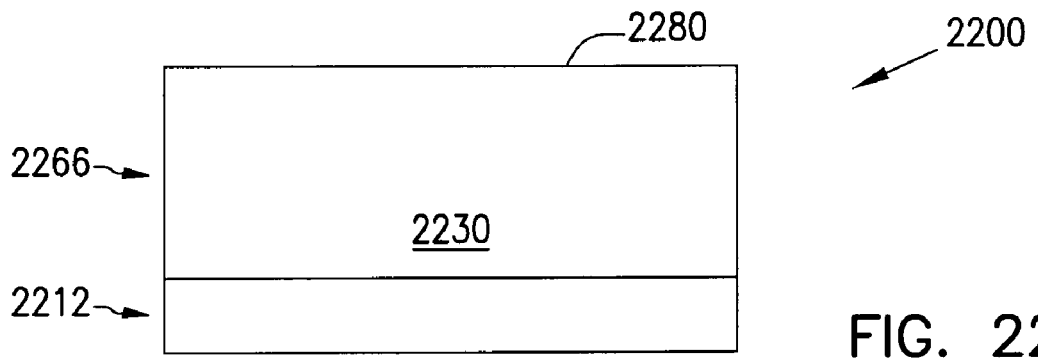
Figure 23:
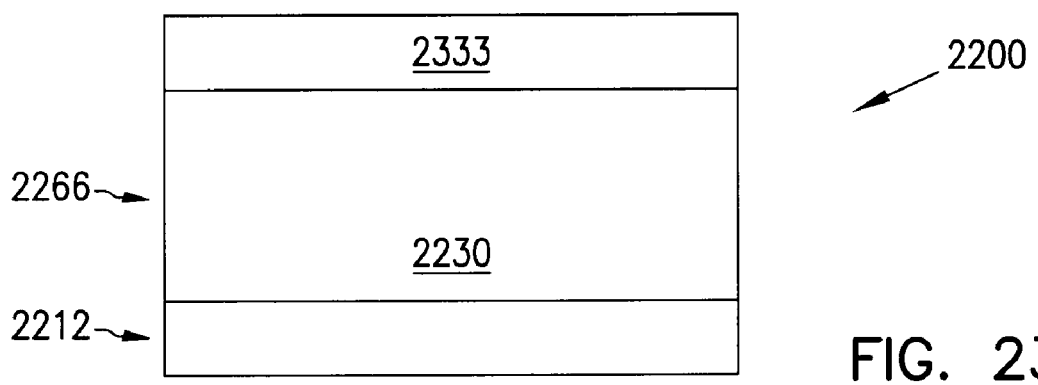
Figure 24:
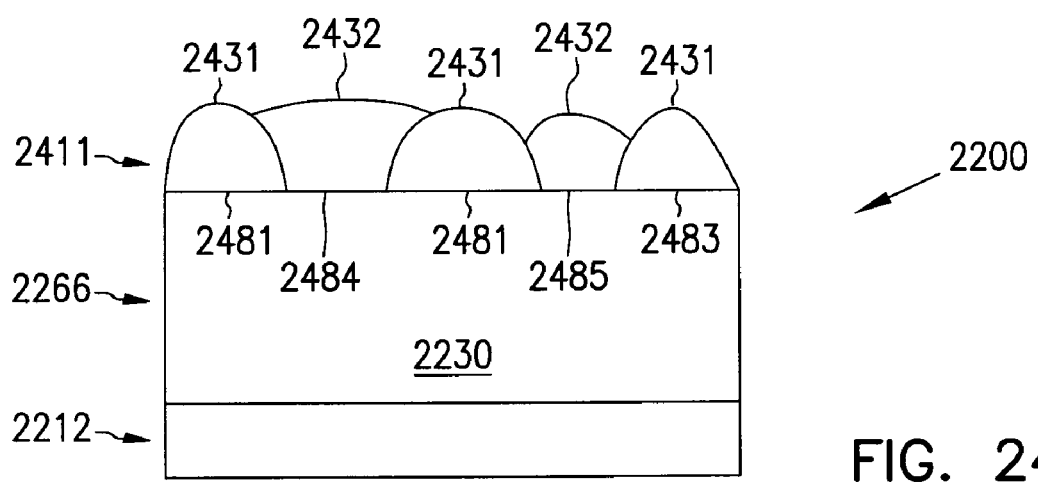

FIG. 22 through FIG. 24 show various processes of forming a memory cell 2200, according to an embodiment of the invention. In FIG. 22, a memory element 2266 has been formed on an electrode 2212. Memory element 2266 and electrode 2212 can have materials similar to or identical to those of memory element 666 and electrode 612, respectively, of FIG. 6. As shown in FIG. 22, material 2230 has a surface 2280.

In FIG. 23, a combination (e.g., an alloy, a mixture, or a compound) of materials 2333 has been formed on surface 2280. Combination of materials 2333 can include at least two elements, such as at least two metal elements. Combination of materials 2333 can include a combination of materials 631 and 632 of FIG. 6. In FIG. 23, forming combination of materials 2333 can include depositing a combination of two or more elements on surface 2280.

In FIG. 24, the elements of combination of materials 2333 have been separated into material 2431 and material 2432. Separating elements of combination of materials 2333 can include annealing combination of materials 2333. After separation, each of materials 2431 and 2432 can include only a single element (e.g., a single metal). Each of materials 2431 and 2432 can also include only a single element a combination of two or more elements. One of materials 2431 and 2432 can also include only a single element and the other material can includes a combination of two or more elements.

As shown in FIG. 24, material 2431 includes different portions that can be approximately randomly located on different areas 2481, 2482, and 2483 of surface 2280. Material 2432 includes different portions that can be approximately randomly located on different areas 2484 and 2485 of surface 2280. Materials 2431 and 2432 can be part of an electrode 2411 of memory cell 2200. Materials 2431 and 2432 can be similar to or identical to the materials of materials 631 and 632, respectively, of FIG. 6.

The above processes of forming a memory cell 2200 include two materials 2431 and 2432, as an example. More than two materials can be formed, using processes similar to those described above with reference to FIG. 22 through FIG. 24. For example, the elements in the combination of materials 2333 in FIG. 23 can be selected such that after the separation of combination of materials 2333, three different materials can be formed on surface 2280 (FIG. 20) of material 2230. In this example, each of the three different materials after the separation can include only a single element or a combination of two or more elements.

The illustrations of apparatus (e.g., memory device 101 and memory cells 100, 200, 300, 400, 600, 1700, 2000, and 2200) are intended to provide a general understanding of the structure of various embodiments and are not intended to provide a complete description of all the elements and features of the apparatus that might make use of the structures described herein.

The apparatus of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus may further be included as subcomponents within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others The embodiments described above with reference to FIG. 1 through FIG. 24 include a memory device and methods of forming the same. The memory device can include an electrode coupled to a memory element. The electrode can include different materials located at different portions of the electrode. The materials can create different dielectrics contacting the memory elements at different locations. Various states of the materials in the memory device can be used to represent stored information. Other embodiments are described above with reference to FIG. 1 through FIG. 24.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The invention claimed is:

1. A memory device comprising:
an electrode including a first material located in a first portion of the electrode and a second material located in a second portion of the electrode; and
a memory element to store information, the memory element including a first location and a second location, the first material including a portion directly contacting the memory element at the first location, and the second material including a portion directly contacting the memory element at the second location, wherein the first and second locations of the memory element include a same material.

2. The memory device of claim 1, wherein the first and second locations of the memory element include a dielectric material.

3. The memory device of claim 2, wherein first and second materials include metals.

4. The memory device of claim 3, wherein the memory element includes a material having oxygen.

5. The memory device of claim 1, wherein the memory element is configured to store multiple bits of information.

6. The memory device of claim 1, further including an additional electrode coupled to the memory element such that the memory element is disposed between the additional electrode and the electrode.

7. A memory device comprising:
an electrode including a first material located in a first portion of the electrode and a second material located in a second portion of the electrode; and
a memory element to store information, the memory element including a first location and a second location, the first material including a portion directly contacting the memory element at the first location, and the second material including a portion directly contacting the memory element at the second location, wherein the memory element includes a third location, and the first material includes an additional portion directly contacting memory element at the third location.

8. The memory device of claim 7, wherein the memory element includes a fourth location, and the second material includes an additional portion directly contacting the memory element at the fourth location.

9. The memory device of claim 8, wherein the portion of the first material and the additional portion of the first material are approximately randomly located within the electrode.

10. The memory device of claim 9, wherein the portion of the second material and the additional portion of the second material are approximately randomly located in the electrode.

11. A memory device comprising:
an electrode including a first material located in a first portion of the electrode and a second material located in a second portion of the electrode; and
a memory element to store information, the memory element including a first location and a second location, the first material including a portion directly contacting the memory element at the first location, and the second material including a portion directly contacting the memory element at the second location, wherein the electrode includes a third material located in a third portion of the electrode, the memory element includes a third portion, and the third material includes a portion directly contacting the third portion of the memory element.

12. A memory device comprising:
an electrode including a first portion and a second portion;
a memory material coupled to the electrode;
a first dielectric directly contacting the first portion of the electrode and located between the first portion of the electrode and the memory material; and
a second dielectric directly contacting the second portion of the electrode and located between the second portion of the electrode and the memory material.

13. The memory device of claim 12, wherein the first dielectric includes a first oxide material and the second dielectric includes a second oxide material.

14. The memory device of claim 12, further including an additional electrode coupled to the memory material such that the memory material, the first dielectric, and the second dielectric are disposed between the additional electrode and the electrode.

15. The memory device of claim 12, wherein the first dielectric and the second dielectric form part of a memory cell of the memory device.

16. The memory device of claim 12, further comprising a third dielectric directly contacting a third portion of the electrode and located between the third portion and the memory material.

17. The memory device of claim 16, wherein the first, second, and third portions of the electrode include materials different from each other.

18. The memory device of claim 12, wherein the first dielectric includes a material different from a material of the second dielectric.

19. The memory device of claim 18, wherein the memory material includes a dielectric material different from the materials of the first and second dielectrics.

20. The memory device of claim 19, wherein the memory material includes $Pr_xCa_yMn_zO$, $La_xCa_yMnO_z$, $La_xSr_yCo_xY$, $TiO_x$, $HfO_x$, or $ZrO_x$.

21. A memory device comprising:
an electrode including a first material and a second material; and
a memory material coupled to the electrode, the electrode and the memory material configured to create a dielectric between at least a portion of the first material and the memory material in response to a signal applied to the electrode, without creating a dielectric between the second material and the memory material in response to the signal.

22. The memory device of claim 21, wherein the memory material is configured to store bits of information.

23. The memory device of claim 21, wherein the electrode and the memory material are configured to create a second dielectric between at least a portion of the second material and the memory material in response to a second signal applied to the electrode.

24. The memory device of claim 23, wherein the first and second materials include different metals and the memory material includes oxygen.

25. A method comprising:
creating a first dielectric directly contacting a first portion of an electrode, such that the first dielectric is between the electrode and a memory material of a memory cell; and
creating a second dielectric directly contacting a second portion of the electrode, such that the second dielectric is between the electrode and the memory material, wherein creating the first and second dielectrics includes applying a signal to the electrode.

26. The method of claim 25, wherein the first dielectric and the second dielectric include different dielectric materials.

27. The method of claim 25, further comprising:
applying an additional signal the electrode to dissolve the first dielectric and the second dielectric.

28. The method of claim 27, wherein the signal has a first voltage polarity and the additional signal has a second voltage polarity.

29. A method comprising:
forming a memory material of a memory cell; and
forming an electrode overlying the memory material, by
 forming a first material on a first area of a surface of the memory material, and
 forming a second material on a second area of the surface of the memory material.

30. The method of claim 29, wherein the first material d the second material are formed as part of the same process step.

31. The method of claim 29, wherein the first material and the second material are formed in different process steps.

32. The method of claim 29, wherein the first and second materials include different metal materials, and the memory material include a dielectric material.

33. The method of claim 29, wherein forming the first material and the second material includes:
forming the first material on least one area of the surface of the memory material such that at least one area of the surface of the memory material is uncovered by the first material; and
forming the second material on the at least one area of the surface of the memory material that is uncovered by the first material.

34. The method of claim 29, wherein forming the first material and the second material includes:
depositing a combination of materials on the surface of the memory material; and
separating the combination of materials to form the first material and the second material.

* * * * *

UNITED STATES PATENT AND TRADEMARK OFFICE
CERTIFICATE OF CORRECTION

PATENT NO. : 8,330,139 B2
APPLICATION NO. : 13/072504
DATED : December 11, 2012
INVENTOR(S) : Durai Vishak Nirmal Ramaswamy et al.

It is certified that error appears in the above-identified patent and that said Letters Patent is hereby corrected as shown below:

On the Title page, in field (75), under "Inventors", column 1, line 2, delete "Bosie, ID" and insert -- Boise, ID --, therefor.

In column 15, line 2, in Claim 27, delete "signal the" and insert -- signal to the --, therefor.

In column 15, line 15, in Claim 30, delete "d" and insert -- and --, therefor.

Signed and Sealed this
Fifth Day of March, 2013

Teresa Stanek Rea
*Acting Director of the United States Patent and Trademark Office*